United States Patent
Sandström (10) Patent No.: US 7,153,634 B2
(45) Date of Patent: *Dec. 26, 2006

(54) DUAL LAYER WORKPIECE MASKING AND MANUFACTURING PROCESS

(75) Inventor: Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 0 days.

This patent is subject to a terminal disclaimer.

(21) Appl. No.: 10/704,957

(22) Filed: Nov. 10, 2003

(65) Prior Publication Data

US 2004/0229169 A1 Nov. 18, 2004

Related U.S. Application Data

(63) Continuation of application No. 09/664,288, filed on Sep. 18, 2000, now Pat. No. 6,645,677.

(51) Int. Cl.
*G03C 5/00* (2006.01)

(52) U.S. Cl. ............ 430/323; 430/5; 430/311; 430/313; 430/314; 430/322; 430/324

(58) Field of Classification Search ........... 430/5, 430/322, 323, 324, 311–314
See application file for complete search history.

(56) References Cited

U.S. PATENT DOCUMENTS

| | | | |
|---|---|---|---|
| 4,530,891 | A | 7/1985 | Nagarekawa et al. |
| 4,782,008 | A | 11/1988 | Babich et al. |
| 5,455,145 | A | 10/1995 | Tarumoto |
| 5,486,424 | A | 1/1996 | Nakato et al. |
| 5,487,967 | A | 1/1996 | Hutton et al. |
| 5,510,230 | A | 4/1996 | Tennant et al. |
| 6,001,513 | A | 12/1999 | Hector |
| 6,645,677 | B1 * | 11/2003 | Sandstrom ............ 430/5 |

FOREIGN PATENT DOCUMENTS

| | | |
|---|---|---|
| EP | 0766138 A2 | 9/1996 |
| EP | 0766138 A3 | 9/1996 |
| GB | 2189903 | 9/1996 |
| JP | 03116147 | 9/1989 |

OTHER PUBLICATIONS

M. Hatzakis et al. "New High-Resolution and High-Sensitivity Deep UV, X-Ray, and Electron-Beam Resists" Journal of the Electrochemical Society, vol. 138, No. 4, pp. 1076-1079 (1991).
D.F. Witman et al. "A Simple Bilayer Lift-Off Process" Microelectric Engineering, vol. 11, No. 1-4, pp. 549-552 (1990).
J. Shaw et al. "Polysiloxanes for Optical Lithography" Solid State Technology, vol. 30, No. 6, pp. 83-89 (1987).
E. Babich et al. "Diazopolysiloxanes: Unique Imageable Barrier Layers" Microelectronic Engineering, vol. 5, No. 1-4, pp. 299-213 (1986).
J. Paraszczak et al. "Plasma Etching of Polymers for Multilayer Lithography" Microcircuit Engineering 84 International Conference Proceedings pp. 517-526 (1985).

* cited by examiner

*Primary Examiner*—Christopher G. Young
(74) *Attorney, Agent, or Firm*—Ernest J. Beffel, Jr.; Haynes Beffel & Wolfeld LLP (57) ABSTRACT

The status of a plurality of service orders is summarized. A first data set that includes a plurality of records corresponding to service orders, such as requests for initiation of telephone or other communications services, is imported into a database application. At least one query or test may be executed on the first data set to generate a second data set that includes at least part of the first data set and one or more labels that have been appended to at least some of the plurality of records in the first data set. This second data set may be imported into a spreadsheet application so that the spreadsheet application can automatically generate a summary of at least some of the data contained in the second data set.

21 Claims, 4 Drawing Sheets

DUAL LAYER WORKPIECE MASKING AND MANUFACTURING PROCESS

RELATED APPLICATION

This application is a continuation of U.S. patent application Ser. No. 09/664,288 entitled "Dual Layer Reticle Blank and Manufacturing Process" by Torbjörn Sandström, filed 18 Sep. 2000 now U.S. Pat. No. 6,645,677.

FIELD OF INVENTION

The present invention relates to preparation of patterned workpieces in the production of semiconductor and other devices. Methods and devices are described utilizing resist and transfer layers over a workpiece substrate. The methods and devices produce small feature dimensions in masks and phase shift masks. The methods described may apply to both masks and direct writing on workpieces having similarly small features, such as semiconductor, cryogenic, magnetic and optical microdevices.

RELATED ART

Semiconductor devices include multiple layers of structures. The structures are formed in numerous steps, including steps of applying resist, then exposing, developing and selectively removing the resist to form a pattern of exposed areas. The exposed areas may be etched to remove material or sputtered to add material. A critical part of forming the pattern in the resist is exposing it. Resist is exposed to an energy beam that changes its chemical properties. One cost-effective way of exposing the resist is with a stepper. A stepper uses a reticle, which typically includes a carefully prepared, transmissive quartz substrate overlaid by a non-transmissive or masking layer that is patterned with areas to be exposed and areas to be left unexposed. Patterning is an essential step in the preparation of reticles. Reticles are used to manufacture semiconductor and other devices, such as flat-panel displays and television or monitor screens.

Semiconductor devices have become progressively smaller. The feature dimensions in semiconductor devices have shrunken by approximately 40 percent every three years for more than 30 years. Further shrinkage is anticipated. Current minimum line widths of approximately 0.13 microns will shrink to 0.025 microns, if the historical rate of development continues for another 15 years.

The pattern on a reticle used to produce semiconductor devices is typically four times larger than that on the wafer being exposed. Historically, this reduction factor has meant that minimum feature dimensions in the reticles are less critical than the minimum feature dimensions on the surface of the semiconductor. However, the difference in criticality is much less than might be expected and will in the near future disappear.

Critical dimension uniformity, as a percentage of line width, is more exacting in the pattern on a reticle than in the features on the surface of a wafer. On the wafer, critical dimension uniformity of plus or minus 10 percent of the line width has historically been acceptable. In the error budget for the wafer line width, the mask has been allowed to contribute half of the critical dimension variation, or a variation of five percent of a line width. Other factors use the remaining error budget. It has been observed that nonlinearities in transfer of a pattern from a reticle to a wafer magnify any size errors in the mask. This is empirically quantified as a mask error enhancement factor (MEEF or MEF). In current technology, the mask error enhancement factor is typically two. Therefore, the critical dimension uniformity on the reticle is reduced to approximately two and one-half percent of a line width, to remain within the error budget.

It is anticipated that requirements for critical dimension uniformity will tighten in time, particularly for masks. On the surface of the wafer, a critical dimension uniformity of plus or minus five percent of the line width will be required in the future. At the same time, the mask error enhancement factor is likely to increase due to more aggressive lithographic process trade-offs, such as tuning the lithographic process to optimize the manufacture of contact holes, transistors or other critical features in order to use feature sizes closer to the theoretical resolution limit. For masks, a critical dimension uniformity of plus or minus one percent of a line width or feature size is anticipated. At this rate, the tolerance for critical dimension errors on the mask will be smaller in absolute nanometers than it is on the surface wafer, despite the fact that the stepper takes advantage of a mask that is four times as large as the area on the wafer that is being exposed.

One of the energy beam sources currently used to expose resist is deep ultraviolet (DUV), in the wavelength range of 100 to 300 nanometers. This energy source is used with two types of resist to produce masks: conventional positive, so called Novolac-DNQ, resist and chemically amplified resist. Essentially all DUV exposure in steppers uses chemically amplified resist. The requirements in pattern generators for patterning of reticles are so different than in steppers that chemically amplified resists are unsuitable for patterning reticles. Work to modify conventional Novolac-DNQ resist to produce a resist suitable for DUV exposure of mask patterns reportedly has failed.

Uniformity and feature size requirements have become so demanding that wet etching no longer is suitable. Wet etching is generally not useable when the size of features approach the thickness of the films the features are etched from. A wet etch etches sideways as much as it etches vertically. Deterioration of the three-dimensional shape of small features results. When chrome is wet etched with resist as an etch mask, the etchant removes chrome under the resist, referred to as undercutting. Clear areas produced by wet etching chrome with a resist mask typically come out 0.2 microns too large. A wet etched resist image with alternating lines and spaces equally 0.4 microns wide, produces a chrome mask pattern where the spaces (clear) are 0.6 microns wide and the lines (dark) are 0.2 microns. This is a large deviation. It is difficult to compensate for this deviation by changing the data or the dose. For smaller features, narrow lines will simply disappear. Therefore any pattern with features smaller than 0.5–0.6 microns wide needs to be produced by dry or plasma etching. The plasma process used to etch chrome produces vertical "line-of-sight" etching characteristics. The chrome is removed only where it is within the line of sight from the plasma source; essentially no undercutting results.

Issues Using Positive Non-Amplified Resists

Positive non-amplified resists provide excellent performance in the violet visible and near UV wavelength ranges. This resist is transparent and has high contrast, giving essentially vertical resist walls and good process latitude. It has good shelf life and mask blanks can be precoated with resist at the time of manufacturing, shipped to users, and kept in storage until needed. Although there is a small decay of the latent image, plates can in principle be exposed today and developed after weeks.

In the DUV wavelength range, both the Novolac resin and the photoactive compound used in Novolac absorb strongly. The edge wall angle after development is partly controlled by the absorption of light and partly by the resist contrast. With high absorption, the features will have strongly sloping edge walls, whatever the chemical contrast. No non-amplified resist formulation is known which combines good contrast with high transparency.

The effect of non-vertical trench walls is significant for narrow lines. One reason for non-vertical trench walls is that a resist layer is eroded by the plasma during the etching. The uniformity of resist erosion is difficult to control since, among other things, it depends on the pattern to be etched. Erosion makes the clear areas larger and varying plasma activity from run to run and across the surface of the workpiece gives a varying CD between masks and within each mask. The variation of the resist thickness at the end of the plasma etching step may be 50 nm peak-to-valley or more. For a wall angle of 80 degrees, instead of 90 degrees, a 50 nm variation in resist thickness produces a variation in trench width, at the bottom of the trench, of nearly 20 nm, which may translate into an undesirable three-sigma deviation of 20 nm. This erosion problem is exacerbated by the high optical absorption of non-chemically amplified resists used with DUV radiation. High optical absorption leads to greater development of the resist at the top of the trench than the bottom, further increasing the variation in line width.

Resist sidewall deviation from 90° vertical inevitably limits the line resolution. In 0.5 micron thick resist layer with a side wall angle of 80 degrees, a line having a width of 0.025 microns at the top of the resist layer is only 0.2 microns wide at the bottom of the resist layer where the chrome is etched. Using current chemistry it is not possible to make the resist thinner than 0.4–0.5 microns and still protect the chrome during the dry etching. If the line at the top of the resist layer is narrowed, the wall angle less favorable or the resist thicker, the line would tend to vanish.

Obviously, each of the problems described gets worse as line widths get smaller, tolerances diminish, and the wavelength move into the deep ultraviolet.

Issues with Chemically Amplified Resists

The use of chemically amplified resists introduces other problems. Chemically amplified resists developed for stepper processing are transparent and have high contrast, giving almost perfectly vertical resist walls. However, they need a thermal annealing or activation step after exposure, that is, a post-exposure bake (PEB). Activation and chemical amplification are highly sensitive to the temperature in time of this bake. Use of chemically amplified resists on reticles is much more difficult than on wafers, due to the thickness and shape of reticles. Reticles are much thicker and less thermally conductive than silicon wafers, making it more difficult to control the baking sequence accurately. Furthermore, reticles are square, leading to corner effects that are not experienced with round wafers. These post-exposure bake problems are not necessarily limited to chemically amplified resists, but are particularly had for chemically amplified resists due to the criticality of the baking step. Non-chemically amplified resists are sometimes baked after exposure to even out standing wave interference effects, leading to the same problems. Post-exposure baking also introduces a latent image diffusion problem, for both kinds of resist, but worse for the chemically amplified resists since the deactivation post bake often requires a substantially different temperature than that optimized for standing wave reduction.

An additional problem of chemically amplified resists is their instability and short working life. Chemically amplified resists have been developed for use with steppers, which can finish 100–500 wafers in the same time that a mask writer produces one mask. Chemically amplified resists are spun on the surface of wafers and prebaked shortly before they are placed in the stepper and are baked shortly thereafter on an automated line, within the relatively short working life of the resist. This makes the current generation of chemically amplified resists unsuitable for use in a mask writer, which may take one to ten hours or more to write a mask and typically operates without an automated processing line. The related problem is that the time from prebaked to post bake depends on the pattern written and is highly variable. As more suitable chemically amplified resists are developed for use with mask making, it will be necessary to take into account the substantial variation in mask writing the time.

Issues Common to All Single-Layer Resists

All single layer resists share properties that makes them less suitable in the foreseeable future. The mask pattern is always wet developed since there exists no process for dry development. Again, the minimum resist layer thickness essentially constant at 0.4–0.5 microns, regardless of the feature size, in order to resist plasma erosion in areas where chrome is not supposed to be removed. As features get very small, wet developed resist structures assume an unfavorable aspect ratio. In a mask pattern with 10 billion features it is highly likely that some of these high aspect ration features will be damaged by hydrodynamic forces and surface tension during wet processing.

For optical exposure, single layer resists further require a trade-off between transparency and interference effects. The thin resist layer needs to be transparent to be exposed from top to bottom, but the transparency makes it subject to optical interference that lowers the effective performance of the resist and increases process variability. Two interference effects are sometimes referred to as standing wave and bulk effects. The standing wave effect results from interference within the resist layer between light directed toward the reticle's surface and light reflected back. The light directed toward the non-transmissive, mirror-like masking layer and the light reflected back from that layer produce a standing wave where the crests and troughs of the directed and reflected light align. This produces vertical bands of more and less completely exposed resist. When the resist is developed and selectively removed, there is a tendency for the sides of the resulting trench to bend in and out, which is referred to as the standing wave effect. The related bulk effect results from interference above the resist layer between light reflected off the surface of the resist and light reflected off the surface of the reticle and back out of the resist. With certain thicknesses of resist, there is destructive interference between the light entering and leaving the resist, allowing a maximum number of photons to stay in the resist layer, producing high sensitivity. Variations in the resist bulk or thickness effect the sensitivity of the film and lead to non uniformity is in the pattern produced. As a resist film is made more transparent, interference effects are reduced, but the etch slope would be worse. These problems are common to ordinary and chemically amplified resists. In wafer lithography the dilemma is normally solved with a thin anti reflecting coating under the resist and sometimes also on top of the resist as well.

Mask production faces additional issues. For instance, production control is difficult due to low production volume. Monitoring and feedback techniques used to improve the quality of semiconductor production are not readily applied to low volume production. Thus, a mask shop needs a more stable process through a semiconductor fab.

Thus, it is desirable to develop a new process for patterning reticles and forming phase shift windows in reticles. The new process preferably would be suitable for non-chemically amplified resists or yet to be developed amplified resists and would yield very small feature sizes with great uniformity by avoiding interference effects and other process hazards.

SUMMARY OF THE INVENTION

An objective of the invention is to produce small features on a reticle with precise critical dimensions, using a technique suitable to a variety of energy sources.

One embodiment of the present invention includes a method of creating a patterned reticle, including creating a latent image in a resist layer using a pattern generator, creating a plasma etch barrier corresponding to said latent image, directionally etching the transfer layer through said plasma etch barrier, and removing the transfer layer to expose unetched portions of the masking layer. According to this embodiment, the resist layer maybe wet developed. It may be less than 200 nm thick and preferably 150 nm thick. The transfer layer maybe between 200 and 500 nm thick, and preferably 350 nm thick. The plasma etch barrier may comprise silicon in the resist layer, which may be present before the latent image is created or may be added after it is created. Alternatively, the plasma etch barrier comprises a separate film between the resist and transfer layers, preferably deposited by sputtering. This etch barrier film may be a metal containing film, comprising aluminum, a metal oxide, silicon, or silicon oxide. A plasma etch barrier comprising a separate film may be patterned by plasma etching through the resist layer. A further aspect of this embodiment is that the transfer layer maybe essentially non-transmissive to an energy beam used to create the latent image. This transfer layer may be removed using a first plasma chemistry. The first plasma chemistry may contain halogen ions and may be an oxygen plasma. The transfer layer may be an organic material. Directional etching of the transfer and masking layer may be carried out by RIE type etching and the transfer layer may be removed by non-preferential oxygen plasma.

Additional embodiment of the present invention includes creating features on a mask blank, including the steps of exposing a resist layer using a pattern generator, developing the resist layer and selectively removing portions thereof, directionally etching a transfer layer underneath the resist layer, directionally etching a masking layer underneath the transfer layer, and removing the transfer layer to expose unhedged portions of the masking layer. The pattern generator uses may use photon energy, electron beams, or particle beams. When photon energy is used, the transfer layer maybe essentially non-transmissive to the wavelength of photon energy used. A variety of wavelengths can be used to create a variety of minimum feature dimensions, because there is a critical relationship between wavelength and resulting feature size. Energy of 300 to 380 nm wavelength can be used to create minimum feature dimensions and 75 to 285 nm. Energy of 200 to 300 nm can be used to create minimum feature dimensions of 55 to 225 nm. Energy of 100 to 220 nm can be used to create minimum feature dimensions of 32 to 124 nm. Energy of five to the 13 nm can be used to create minimum feature dimensions of 6 2 44 nm. When the electron beam is used, less than 3000 eV energy is preferred. Minimum feature dimensions of 2270 nm to be created. Depending on type of energy beam used, the minimum feature dimensions created may be in the ranges of 75–285 nm, 55–225 nm, 32–124 nm, or 6–44 nm. An aspect of this embodiment is that the pattern generator can be aligned to the reticle when the resist and transfer layers are transmissive to a certain, non-exposing wavelength of light by observing features beneath the resist and transfer layers. With a transfer layer that is more absorptive than the resist layer to another certain wavelength of light, the pattern generator can autofocus on the interface between the resist and transfer layers.

According to a further aspect of the invention, multiple passes may be used to expose the resist layer, preferably four passes. The exposure passes showed take place in essentially opposing directions, yielding an average time between exposure and completion of the final exposure passes which is essentially equal for locations dispersed across the reticle.

Additional aspect of the present invention is that a plasma comprising oxygen and silicon dioxide can be used to selectively remove a silicon containing resist. The resist can be treated with silicon prior to developing. Useful silicon treating compounds includes silane, liquid compounds and gaseous compounds. The silicon can be treated after development and before removal of the resist. Resist development can be carried out by wet or dry development.

Either embodiment of the present invention can be enhanced by a including in steps of inspecting and repairing the selectively removed resist. Alternatively, the developed resist can be inspected and features precisely widened to match a critical tolerance.

The directional etching of the transfer or masking layers according to either embodiment can be carried out by plasma etching or reactive ion etching. Chlorine may be used in etching gas to remove a masking layer. The transfer layer may comprise an organic material, preferably one adapted to planarizing the masking layer and dyed with a DUV-absorbing dye. The masking layer may comprise more than one physical layer, for instance a layer of chrome overlaid by an antireflective layer of nonstoichiometric chrome oxide.

Another embodiment of present invention is a method of preparing a reticle blank for patterning, including the steps of forming a masking layer a reticle substrate, spinning an organic layer over the masking the layer, baking the organic layer, spinning a positive silicon-containing resist layer over the organic layer, and baking the resist layer. According to this embodiment, the masking layer may be comprised of chrome in the range of 40–90 nm thick. Alternatively, it may comprise aluminum or tungsten. On a quartz reticle substrate, the masking layer may comprise a patterned structure. The resist layer maybe between 50 and 200 nm thick, preferably 150 nm thick. The resist and transfer layers may have different characteristics of absorbing certain wavelengths of light, so that a pattern generator can focus on the interface between these layers.

DETAILED DESCRIPTION

Following detailed description of the invention and embodiments practicing the invention is made with respect to the figures. It is presented for purposes of illustration and description. It is not intended to limit the invention to the precise forms disclosed. Many modifications and equivalent arrangements will be apparent to persons of ordinary skill in the art.

Figure 1A:
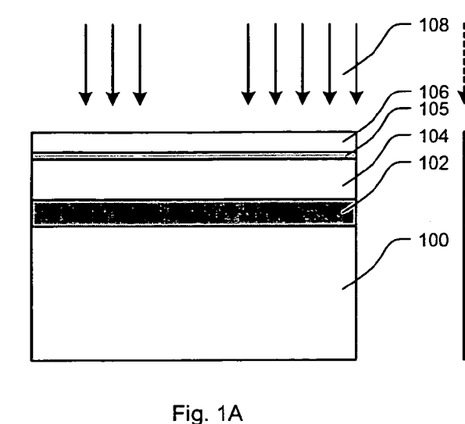
FIGS. 1A–1E depict a dual layer reticle blank structure and a process for preparing a patterned reticle using dual layers of resist and transfer medium.

FIGS. 1A through 1E depict a coated reticle blank and process steps for a method of removing a non-transmissive layer from the surface of the reticle. In FIG. 1A, the coated reticle comprises a reticle blank 100, a masking or non-transmissive layer 102, a transfer layer 104, and a resist layer 106. Optionally, it may include a plasma resistive layer 105 between the transfer layer 104 and the resist layer 106. The reticle blank 100 often comprises a quartz substrate, a Zerodun™ ceramic substrate or an ULE™ glass substrate. One form factor currently used is 152 mm by 152 mm by 6.25 mm thick. In one style of mask, the blank is transmissive to an energy beam used during the manufacture of semiconductor devices. A mask is formed over the blank to block the passage of the energy beam in areas where resist on a wafer is intended not to be exposed. Unmasked portions of the blank allow an energy beam to pass through and form a pattern on the wafer resist. In another style of mask, the portions of the mask-blank system reflect and absorb the energy used to expose the resist. This style of mask is used in projection lithography.

With some energy sources, a phase shift mask can be used. The thickness of a substrate may be altered either by removing some material from the reticle, for instance by etching, or by adding material, such as a dielectric, to selected portions of the mask. A thicker mask transmits light more slowly. When the passage of light is retarded by half a wavelength, destructive interference results between adjacent areas where light passes retarded and unretarded through the reticle.

The non-transmissive masking layer 102 of a coated reticle typically includes a chrome masking layer approximately 40–90 nm thick. The chrome material may be applied by sputtered deposition. Alternatively, aluminum, gold, tungsten, or silicon could be used to form the non-transmissive, masking layer. Optionally, the non-transmissive layer may also include an anti-reflective layer. Non-stoichiometric chromium oxide material approximately 30 microns thick can be used to reduce reflectivity. This enhances performance when the mask is used in a stepper, but it is not necessary for patterning the mask. Its presence may reduce standing wave and bulk interference effects. However, optical focusing systems used in both steppers and pattern generating equipment require some reflection to be effective. Therefore, the anti-reflective component of a non-transmissive layer cannot be perfectly absorbing. Alternatively, the non-transmissive layer 102 could be a structure, such as used in a so called "chromeless phase shifting" mask, formed on or in the surface of the reticle which reflects, diffuses or absorbs the energy beam, so that an energy beam directed to a non-transmissive region would not produce a threshold exposure in the resist underlying the region. Alignment marks or features may be formed in the non-transmissive layer, which are useful for aligning the coordinate system of the mask making equipment. For a projection style reticle, a different type of masking layer is used, which is known in the art, to produce areas of the reticle which reflect and absorb energy.

Over the non-transmissive layer, but not necessarily directly on it, a transfer layer 104 is applied. This layer may be spun on using conventional techniques to form a layer approximately 0.2–0.5 microns thick. Preferably, an organic material is used which includes a DUV-absorbing dye, preferably using a dye selective to absorption of exposure radiation and transparent to alignment radiation. The material used in the transfer layer should tend to planarize the surface, especially when spun on. This is particularly useful when the non-transmissive layer has already been patterned. When a photon beam is used to expose the resist, use of an energy absorbing dye has several advantages. For focusing, it provides a target. At the same time, a selectively DUV-absorbing dye would allow an optical alignment system working at 532 nm to take advantage of the transparency of the transfer layer and overlaying resist layer to align two features in the non-transmissive layer, particularly after initial patterning of a layer. The transfer layer reduces the amount of light reflected from the non-transmissive layer, thereby minimizing standing wave effects. At the same time, it reduces the amount of reflected light which escapes the transfer layer, thereby minimizing bulk effects. The transfer layer produces these advantages without the disadvantage of higher absorption on top than at the bottom of the resist layer. After application of the transfer layer, baking at 150–180 degrees Celsius will drive out the solvent and improve the resistance to the transfer layer to plasma etching.

Optionally, over the transfer layer, but not necessarily directly on it, a plasma resistive layer 105 is applied. This layer may be sputtered on. It preferably is a silicon layer, which forms silicon dioxide when exposed to certain plasmas, particularly an inorganic silicon layer.

Over the transfer layer and the optional plasma resistive, but not necessarily directly on them, a resist layer 106 is applied. This layer may be spun on using conventional techniques to form a layer approximately 0.05–0.20 micron thick, and more preferably, approximately 0.15 micron thick. Is preferred to use a positive resist, because it is easier to expose fine lines than to expose the surrounding area, leaving fine lines unexposed. The resists used with photon energy may be referred to as photoresists. Other types of resist are used with other forms of energy. Optionally, a silicon-containing resists may be used to enhance the selectivity of plasma etching, as described further below. The silicon content of approximately 7 to 10 percent is desirable. After application of the resist layer, baking at 90 degrees Celsius will drive out the solvent. The material selected for the transfer and resist layers preferably should have good shelf life and stability so that the mask-blank manufacturer can precoat the blanks.

The refractive index of the resist layer 106 should match as closely as practical the refractive index of the transfer layer 104, in order to minimize standing wave interference effects. The standing wave interference effects of the double layer system, using resist over a transfer layer, can be analyzed by applying Brunner's formula. The action of bottom and top antireflective layers on the swing amplitude S is described in good approximation by Brunner's formula, when a two layer system is treated as a single layer:

$$S = 429 \sqrt{R_b \Box R_t} \Box e^{-\alpha d}$$

Where, $R_b$ is the reflectivity at the interface between the transfer layer and the masking layer. $R_t$ is the reflectivity of the interface between the resist and air, which may be reduced by an antireflective top coating. "alpha" is the rate of absorption of exposure radiation by the resist, per unit thickness. "d" is the thickness of the absorbing resist layer. When the resist and transfer layers have approximately the same refractive index, the reflection at that interface approaches 0. Thus, Brunner's formula can be applied to the resist and transfer layers as a single layer. The combined single layer has a value of alpha *d>>1, so the exponential factor in Brunner's formula is very small. As the exponential factor vanishes, the value of S for the combined resist and transfer layers is also very small. The exact value of alpha *d can be chosen by varying the dye content of the organic material or transfer layer. The two layer system allows much greater freedom in adjusting the value of alpha *d than a single resist layer, where a low absorbance value of alpha *d<1 is ordinarily preferred. For a single layer resist, the low absorbance is ordinarily preferred to give an acceptable edge slope, so that the sides of the trench after development and selective removal of portions of the resist will be nearly vertical.

Figure 2A:
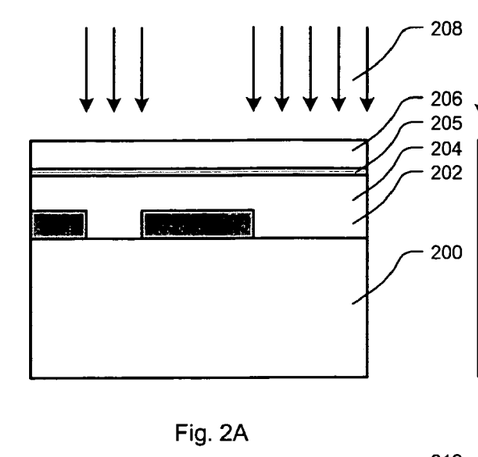
FIGS. 2A–2E also depict a dual layer reticle blank structure and a process. This process is for preparing a phase shift mask.

A variation on FIG. 1A appears in FIG. 2A. The structure includes a transmissive substrate 200, non-transmissive layer 202, transfer layer 204 and resist layer 206. In this structure, part of the non-transmissive layer 202 was selectively removed before additional layers were applied. It is particularly useful for the transfer layer in this structure to be suitable for planarizing, because the non-transmissive layer is patterned. As patterning is performed at a mask shop, a structure depicted in FIG. 2A is likely to be formed at a mask shop and unlikely to be stored for long periods of time.

Figure 1B:
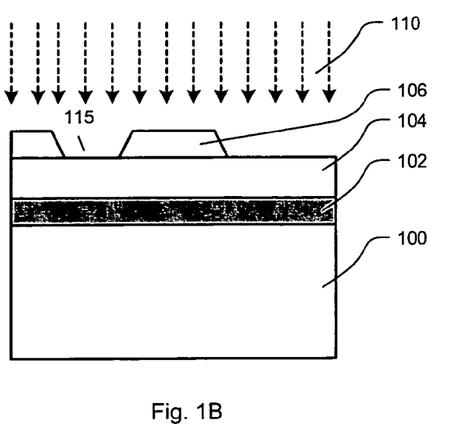
Figure 1C:
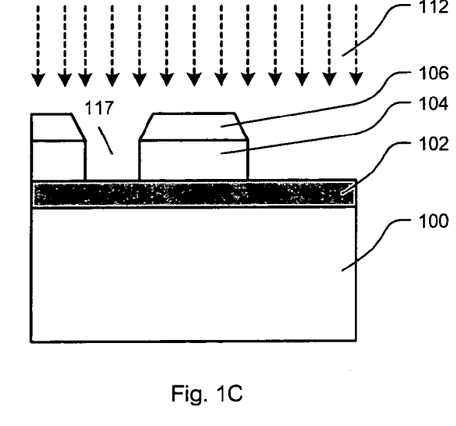
Figure 1D:
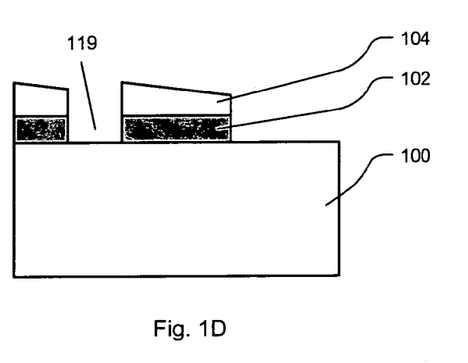
Figure 1E:
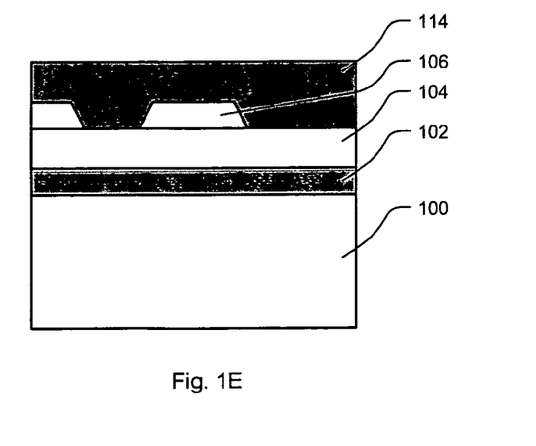

A process embodying the present invention is depicted in FIGS. 1A through 1D, with a process variation shown in FIG. 1E. In FIG. 1A, the resist layer 106 is exposed to an energy beam 108. In practice, this radiation or energy may be any of wide variety of types. Photon energy may be in the UV, the DUV, EUV or x-ray spectrum ranges. For instance, photon energy may be a spectrographically separated or processed through a cut filter from a high-pressure mercury vapor arc light or super high pressure xenon-mercury light, at the g line (approximately 436 nm), the h line (approximately 406 nm), the i line (approximately 365 nm) or the j line (approximately 313 nm). Photon energy also may be generated by a helium cadmium source (approximately 442 and 325 nm), a solid state source (approximately 430 and 266 nm) a krypton ion source (approximately 413 nm), an argon ion source (approximately 364 and 257 nm). Or, it can be generated by an excimer source or a krypton-fluoride or an argon-fluoride laser (approximately 308, 248, 193, 157 or 126 nm). The NanoStructures Laboratory of the Massachusetts Institute of Technology has additionally identified an undulator light source at the University of Wisconsin (approximately 13 nm) and the L line of copper (approximately 1:32 nm) from a helium-filled exposure chamber as sources used in research. Other wavelengths produced by a xenon gas capillary discharge take include 13.5 nm and 11.4 nm. An electron bombardment source yields 4.5 nm radiation. The wavelengths of these photon energy sources are critical to the minimum feature dimensions that may be created, with shorter wavelengths being more difficult to use and having more potential to generate smaller features.

Likely feature sizes for many photon energy sources are illustrated in the table below:

|  | Widest |  |  |  | Narrowest |
|---|---|---|---|---|---|
| Source |  |  |  |  |  |
| HeCd | 442 | 497 | 249 | 221 | 111 |
| Solid state | 430 | 484 | 242 | 215 | 108 |
| Kr-ion | 413 | 465 | 232 | 207 | 103 |
| Ar-ion | 364 | 410 | 205 | 182 | 91 |
| HeCd | 325 | 366 | 183 | 163 | 81 |
| Excimer | 308 | 347 | 173 | 154 | 77 |
| solid state × 4 | 266 | 299 | 150 | 133 | 67 |
| Ar-ion × 2 | 257 | 289 | 145 | 129 | 64 |
| Excimer | 248 | 279 | 140 | 124 | 62 |
| Excimer | 193 | 217 | 109 | 97 | 48 |
| Excimer | 157 | 177 | 88 | 79 | 39 |
| Excimer | 126 | 142 | 71 | 63 | 32 |
|  | 13 | 29 | 15 | 13 | 7 |
|  | 11 | 25 | 12 | 11 | 6 |
|  | 5 | 11 | 6 | 5 | 3 |

These values are calculated based on $k_1$=0.45, 0.20 and NA=0.20, 0.40, 0.80.

Figure 5:
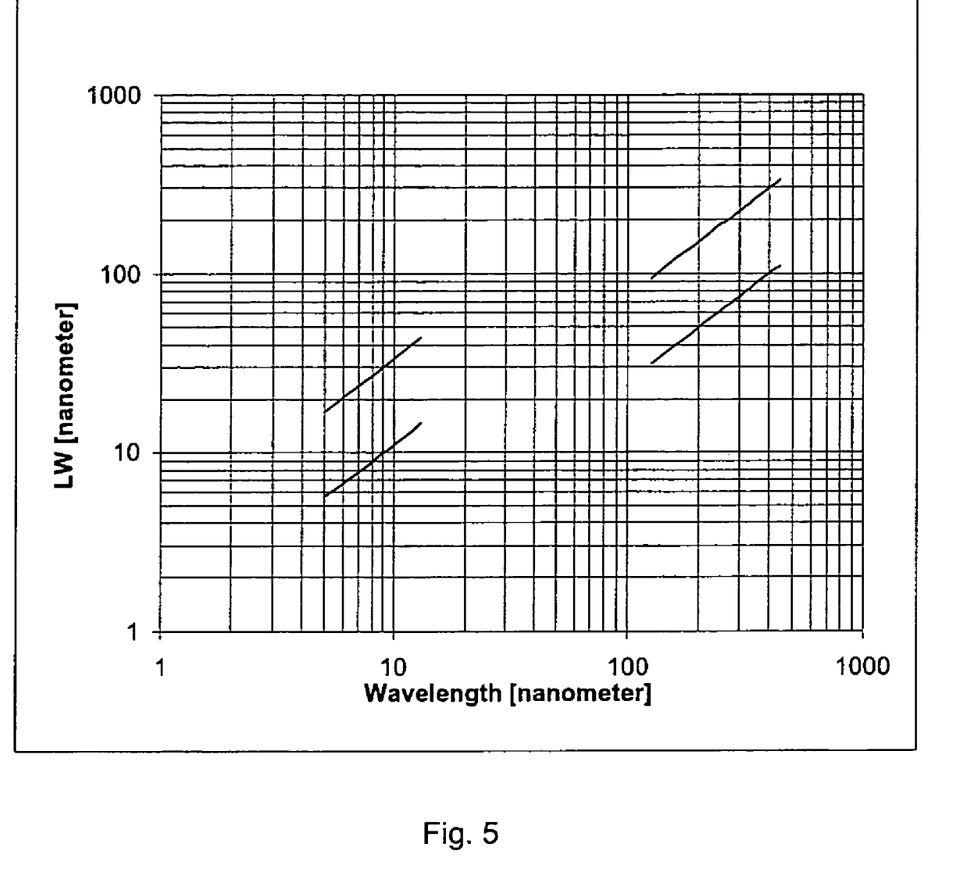
FIG. 5 is a graph of minimum line width ranges for varying wavelengths of photon energy beams.

The critical relationship between wavelength and linewidth is illustrated in FIG. 5. This relationship is expressed as:

$$MLW = k_1 \cdot \frac{\lambda}{NA},$$

where MLW is the minimum line width, $k_1$ is an empirical factor, which is more favorable when optical proximity correction measures are implemented, $\lambda$ is the wavelength of the photon source, and NA is the numerical aperture for exposure.

The relationship in FIG. 5 depicts a 3 to 1 range of MLW, with the narrowest lines based on $k_1$=0.20 and NA=0.80. The widest lines reflect less favorable values of $k_1$, and NA. Accordingly, in a wavelength range of 380–450 nm, which brackets the 413–442 nm sources, the critical minimum feature dimensions or minimum line widths are approximately 95–340 nm. In the wavelength range 300–380 nm, which brackets the 308 and 364 nm sources, the critical minimum feature dimensions or minimum line widths are 75–285 nm. In the wavelength range of 220–300 nm, which brackets the 248 and 266 nm sources, the critical minimum line widths are 55–225 nm. In the wavelength range of 100–220 nm, which brackets the 126–193 nm sources, the critical minimum line widths are 32–124 nm. In the wavelength range of 5–13 nm, the minimum line width is based on $k_1$=0.45, NA=0.40 and a 3 to 1 range of widest to narrowest lines produced under varying $k_1$ and NA factors. The critical minimum line widths for these wavelength sources are 6–44 nm. In this manner, ranges of critical minimum feature dimensions can be matched to individual source wavelengths, ranges of source wavelengths, or bracketed source wavelengths. Alternatively, particular minimum critical dimensions could be claimed for each wavelength source from the data in FIG. 5.

In addition to photon energy, low-energy electron beams and charged particle beams have been suitably used for exposing resists. The Raith Turnkey 150 system, produced by Raith company in Dortmund, Germany is rated for electron beams of 200 eV to 30 KeV. MIT's NanoStructures Laboratory reports that it can operate at beam energies as low as 10 eV. An ion beam source for writing a pattern on a suitable resist is described by Westererg and Brodie, "Parallel Charged Particle Beam Exposure System," U.S. Pat. No. 4,465,934. Most generally, the energy source being used needs to be matched to the characteristics of the resist being exposed.

Exposure of the resist is performed using a pattern generator. For photon energy, a laser pattern generator or an interference lithography system may be used. For electrons, an electron-scanning device may be used. Etec, a subsidiary of Applied Materials, sells an ALTA™ line of scanning laser pattern generators. Micronic Laser Systems of Taby, Sweden sells an Omega™ line of scanning laser systems and has described a Sigma™ line of micromirror-based systems. The NanoStructures Laboratory, working with the University of Wisconsin in some aspects, has described interference lithography systems with spatial periods of 200 nm, 100 nm, and 50 nm. The 100 nm spatial period system has been used to create features (reassembling silicon whiskers) having diameters of 13 nm. The NanoStructures Laboratory also has described a Zone-Plate Array lithography system employing micromirrors to generate lines 200 nm in width, with improvements anticipated to generate lines 20 nm in width. The Etec subsidiary of Applied Materials also sells a MEBUS™ line of Gaussian beam pattern generators.

At least in the case of DUV energy, it is preferred to use four passes or more to generate the scanned pattern. Pattern generation should be arranged so that the average energy dose and the average time from dosing to completion are approximately constant for different points on the mask. The preferred strategy for doing this is to write in one direction for some passes and to write in essentially the opposite direction for other passes. This is conveniently done writing in a first direction on one pass and writing in a second, essentially opposite direction on the subsequent pass. This approach helps control the decay of latent images in the resist layer. At the time the resist is developed, this writing strategy yields approximately equal average times from exposure to development throughout the reticle.

The exposure in FIG. 1A forming a latent image in the resist is followed by developing and selectively removing portions of the resist. Wet developing is suitable, to be followed by rinsing and drying. The patterned resist is depicted in FIG. 1B. Some resist 106 remains. In other places 115, resist has been removed creating trenches. The sides of the trench 115 are somewhat sloped due to the isotropic action of the developing and selective removal process and to the absorbance pattern of light in the resist.

The selective removal of resist is optionally followed by inspection and repair of the patterned resist layer. In some circumstances inspection and repair at this stage may be more effective than if it is done later, particularly when these process steps lead to etching of a phase shift window in the reticle substrate, as depicted in FIG. 2. Alternatively, inspection and repair could follow etching of the transfer layer, still preceding etching of either the non-transmissive layer or a phase shift window in the patterned mask.

Precise correction the minimum feature dimensions may be accomplished by writing and developing openings in the resist which are slightly too small, such as 10 nm narrower than desired. Inspection tools can be used to measure very precisely the width of lines written. A slight isotropic etching, for instance by gas, wet etching or plasma, can be employed to adjust the size of openings in the resist layer, widening lines by 5 to 15 nm before pattern transfer. This form of correction improves the uniformity of minimum feature dimensions. It also cleans up the patterns in the resist.

A process variation is shown in FIG. 1E, which involves silylation of the resist. In some instances it will be preferable for the resist to be infused with a silicon-containing compound, such as silane. A liquid or gaseous silicon-containing compound 114 is applied over the resist. This may be done either after development and selective removal, as depicted in FIG. 1E, or before development. One option is dry development of the resist after silylation of the latent image. Another option, not separately shown, is to include silicon content in the top of the transfer later.

When a plasma resistive layer 105 is present, the logical step of creating a plasma resistive layer corresponding the latent image in the resist may involve more than one process step. Separate process steps may be used to develop and selectively remove the resist and then to remove corresponding areas of the plasma resistive layer. These steps may precede or follow correction of minimum feature dimensions in the resist layer.

Returning to FIG. 1B, the patterned resist layer is exposed to directional etching. The transfer layer below is directionally etched, with a strongly vertical preferential etch gas 110. Techniques for directional etching include reactive ion etching (RIE) and plasma etching. Plasma etching generally takes place in or near gas discharge using a low-pressure process gas such as $O_2$, $CF_4$, etc. Various forms of plasma etching can be used for near-isotropic etching or for vertical anisotropic pattern transfer etching. Suitable processed gases and plasma conditions have been developed for etching thin-film materials used microlithography, such as silicon, silicon dioxide, aluminum, chromium, resist, and polyamide. One reference on suitable process gases and plasma conditions is "Handbook of Plasma Processing Technology", Noyse Publications, 1990, ISBN 0-8155-1220-1. Reactive ion etching is suitable for vertically anisotropic etching with good line width control. The simplest configuration for RIE equipment is a parallel plate etcher, in which the workpiece is placed on the RF-driven electrode, typically driven at a frequency of 13.56 MHz. A discharge in the plasma creates a DC bias which accelerates ions towards the surface the workpiece. A plasma pressure of 10 to 50 millitorrs is often used. Other reactor types such as an inductively coupled plasma reactor also can be used.

A suitable plasma for etching through the transfer layer may include oxygen and a small amount of sulfur dioxide. Including silicon in a resist 106 forms a silicon dioxide etch barrier which protects the patterned resist the oxygen plasma, reducing erosion of the resist. The result of the process depicted in FIG. 1B is the structure in FIG. 1C. A vertical or near vertical trench 117 cuts through the transfer layer 104, after exposure to the etch gas. Some resist 106 and organic material 104 remains.

The patterned resist 106 and transfer layer 104 are subjected to an additional directional etching gas 112. To etch through the non-transmissive layer, a slightly different gas mixture is used. A suitable plasma may contain a halogen, such as chlorine. The composition and energy of the plasma should be selected so that it removes the transmissive layer in the exposed trenches 117. It also may be desirable for this plasma step to remove the silicon-containing resist 106. This directional etching step may be carried out in the same device or apparatus as is used to transfer the pattern from the resist layer 106 to the transfer layer 104. Using the same RIE device, plasma etcher or other apparatus would minimize the number a wafer transfers required to pattern the non-transmissive layer. The result of this process to appears as the structure in FIG. 1D. The non-transmissive layer 102 has been etched yielding a trench 119.

The width of the trench 119 is likely to be the minimum feature size generated by this process. This minimum feature size relates the wavelength of the energy used to expose the resist, when photon energy is used. Shorter wavelengths present a number of problems, which practically restrict their use to production of very small feature sizes. For instance, EUV energy is not readily focused using conventional lenses. It is absorbed in glass and passes through many conventional mirror materials. Given a practical trade-off, EUV energy having wavelengths of 5 to 13 nm is most likely to be used to generate features having minimum dimensions of 6 to 44 nm. DUV energy is expected to be generated by an excimer, gas or solid state source having wavelengths of approximately 100–220 nm and is most likely to be used to generate features having minimum dimensions of 32–124 nm. DUV energy having wavelengths of 220 to 300 nm is most likely to be used to generate features having minimum dimensions of 55 to 225 nm. UV energy can be generated by spectrographically separating or processing through a cut filter the emissions of a high-pressure mercury vapor arc light or super high pressure xenon-mercury light. This approach produces i line energy of approximately 365 nm or j line energy of approximately 313 nm. Alternatively, a helium-cadmium laser may be used to produce radiation approximately 325 nm. Near UV energy having wavelengths of 300 to 380 nm is most likely used to generate features having minimum dimensions of 75 to 285 nm. Other energy beams can be generated by spectrographically separating or processing through a cut filter the emissions of a high-pressure mercury vapor arc light or super high pressure xenon-mercury light. This approach produces g line energy of approximately 436 nm or h line energy of approximately 406 nm. Other energy of 380–450 nm wavelength is most likely used to generate features having minimum dimensions of 95–340 nm. The use of low-energy electron beams in the practice the present invention has the potential to generate minimum feature sizes of 10 to 100 nm. Charged particle beams may generate minimum feature dimensions of 5 to 50 nm. As described, the width of the trench 119 is critically dependent upon the type of energy beam used to expose the resist. The present invention improves the critical dimension control and ability to produce fine lines across types of energy beam.

The same plasma reactor used for pattern transfer can also be used for ashing to remove the remainder of the transfer and resist layers. For pattern transfer, the plasma reactor needs to produce a plasma stream for etching which is as vertically anisotropic as possible. Reactive ion etching or equivalent will accomplish this. The plasma is low-pressure. A high potential is created on the workpiece. A flat plate reactor may be used to generate the high potential on the workpiece using RF energy. The effect is somewhat like sputtering. For ashing to remove the transfer layer, and an isotropic process is preferred, though vertical alignment of the plasma is not critical. A relatively high-pressure of plasma is used, exceeding 200 millitorrs. The workpiece has a low potential. The plasma creates reactive species which diffuse to the surface and etch the transfer layer chemically, to remove it. A flat plate reactor may be used with the workpiece grounded. Alternatively, a barrel reactor with microwave excitation of the plasma may be used. For ashing, oxygen with a small amount of sulfur dioxide is suitable for removal of organic residues. In the flat plate reactor, a double RF drive with double matching networks may be particularly useful. With a double drive, the cathode and workpiece table are driven independently. A single crystal oscillator can generate the RF frequency for both drives. By controlling the phase and power of the two drives independently, the workpiece potential can be controlled within wide limits. One alternative to a flat plate reactor is the split cathode design described in L. Hollins et al., Journal of Scientific Instruments, Vol. 1, p. 32 (1968).

The process described with respect to FIG. 1 also applies to etching a phase shift window in a reticle, as depicted in FIG. 2. In FIG. 2A, the initial structure before exposing the resist layer with energy is depicted. The coated reticle comprises a blank reticle 200, one or more non-transmissive layers 202, a transfer layer 204 and a resist layer 206. The blank reticle 200 typically is a quartz substrate, as described above. The non-transmissive layer 202 of the structure has been patterned, for instance by using the process described above. The non-transmissive layer of the coated reticle typically includes a patterned chrome layer approximately 40–90 nm thick. Alternatively, aluminum, gold, tungsten or silicon can be used to form the non-transmissive, masking layer. Optionally, the non-transmissive layer may also include an anti-reflective layer. Non-stoechiometric chromium oxide material approximately 30 microns thick can be used to reduce reflectivity. Again, this enhances performance when the mask is used in the stepper, but it is not necessary for creating phase shift windows in the mask. Alternatively, the non-transmissive layer 202 could be a structure formed on or in the surface of the reticle which reflects or diffuses an energy beam, so that the energy beam projected on a non-transmissive region would not produce a threshold exposure in the resist underlying that region. The pattern generated in the non-transmissive layer is useful for aligning the coordinate system of the mask making equipment.

Over the non-transmissive layer, but not necessarily directly on it, a transfer layer 204 is applied. This is relatively thick layer, preferably of organic material. A suitable material is Novolac, the resin component used in most positive non-amplified photoresist. It has excellent adhesion and good plasma etch resistance, and is transparent in visible and UV and absorbing in the DUV. Conventional techniques for spinning on this layer can be used to form a layer of approximately 0.2 to 0.5 microns thick, and preferably approximately 0.35 microns thick. If the organic material is not inherently absorbing, and is used with optical wavelengths it can include an absorbing dye, preferably a dye that selectively absorbs exposure radiation and is relatively transparent to alignment radiation. It is particularly useful that the transfer layer material tends to planarize the surface, especially when spun on. The differential absorbance of the dye permits different energy beam to be used for exposure and alignment, without the alignment energy beam compromising the feature size. The absorbance of exposure radiation minimizes interference effects, both standing wave and bulk interference effects.

Optionally, over the transfer layer, but not necessarily directly on it, a plasma resistive layer 205 is applied. This layer may be sputtered on. It preferably is a silicon layer, which forms silicon dioxide when exposed to certain plasmas, particularly an inorganic silicon layer.

Over the transfer layer and the optional plasma resistive, but not necessarily directly on them, a resist layer 206 is applied. Conventional techniques for spinning on this layer may be used to form a layer approximately 0.05 to 0.20 microns thick, and preferably 0.15 microns thick. Optionally, a silicon-containing resist may be used to enhance the selectivity of plasma etching. The resist may contain silicon initially, before it is baked, or a silylation process can be used to infuse silicon in the resist. Because the structure depicted in FIG. 2A has a patterned structure, it is anticipated that the transfer and resist layers will be applied in the mask making shop, after patterning of the non-transmissive layer. A good working life for the transfer and resist layers is more important than a good shelf life.

Figure 2B:
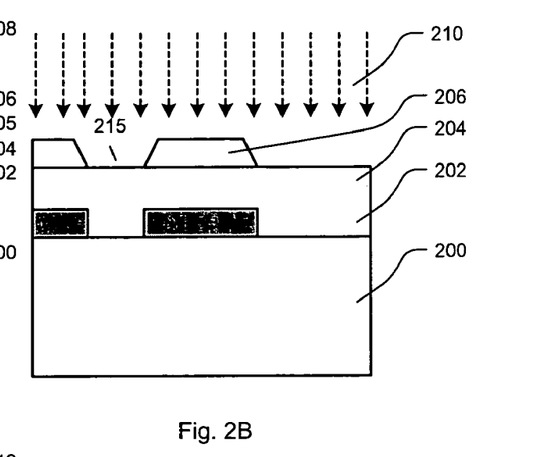
Figure 2C:
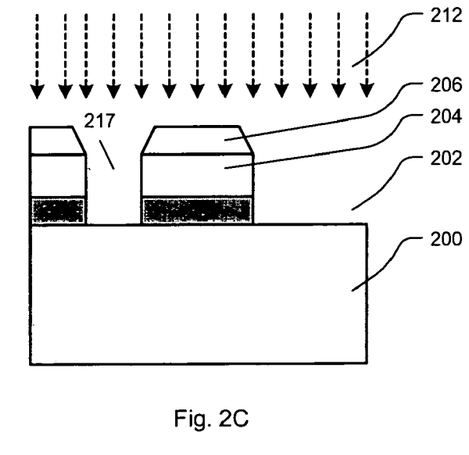
Figure 2D:
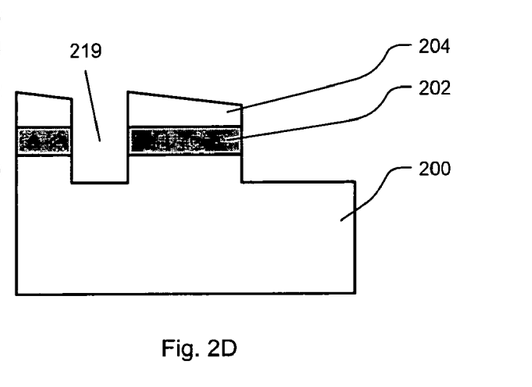
Figure 2E:
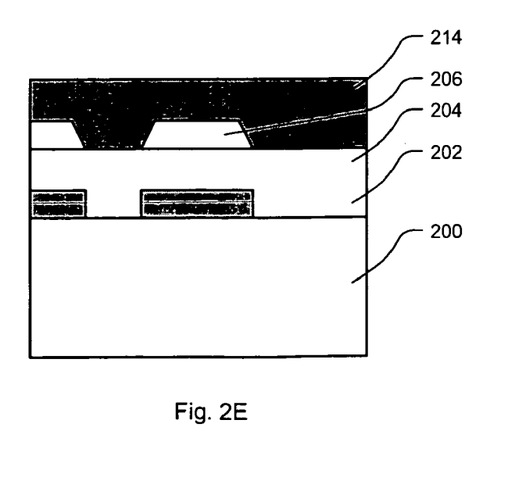

A process embodying the present invention, following the same progression as in FIG. 1 is depicted in FIGS. 2A through 2D, with a process variation shown in FIG. 2E. Not shown in these figures use the use of an optical alignment system using as 532 nm photon energy beam source, taking advantage of the transparency of the resist and the transfer layer at this wavelength to see the pattern in the non-transmissive layer. Following alignment of the pattern generator coordinate system with the patterned reticle, the resist layer 206 in FIG. 2A is exposed to an energy beam. This may be a photon energy beam, a low-energy electron beam, a charged particle beam or any other energy beam suitable for exposing the particular resist being used. The energy beam exposes the resist using a pattern generator. The pattern generation scheme should use multiple passes so that the average energy dose and the average time from dosing to completion is relatively constant across the mask. This helps control the decay of latent images in the resist layer.

Developing and selectively removing the resist follows the exposure in FIG. 2A. The patterned resist is depicted in FIG. 2B. The trench 215 is over all or part of an area where the non-transmissive layer has been etched away. In practice, the etched area of the non-transmissive layer may be wider than the trench 215, where a phase shift window is desired, because phase shift windows are often adjacent to non-shift windows in the non-transmissive layer.

Inspection and repair of the trench 215 optionally follows selective removal of the resist. In some cases, inspection and repair at this stage may be more effective than it is done later. Repair of the patterned resist is likely to be easier than modifying the shape of a phase shift window etched into a substrate such as quartz. The structure resulting from directionally etching the patterned resist 206 with plasma 210 is depicted in FIG. 2C.

A process variation is shown in FIG. 2E, which involves silylation of the resist after exposure. In some instances it will be preferable for the resist to be infused with silicon compound, such as silane, after patterning. A liquid or gaseous silicon-containing compound 214 is applied over the resist. This may be done either after development and selective removal, as depicted in FIG. 2E, or it may be done before development of the resist. One option, when silylation is performed prior to development, is dry development of the resist.

FIG. 2C depicts a trench 217 through the transfer layer 204 exposing the reticle substrate 200. Additional plasma 212 is used to directionally etch a phase shift window in the substrate 200, as depicted in FIG. 2D.

Figure 3A:
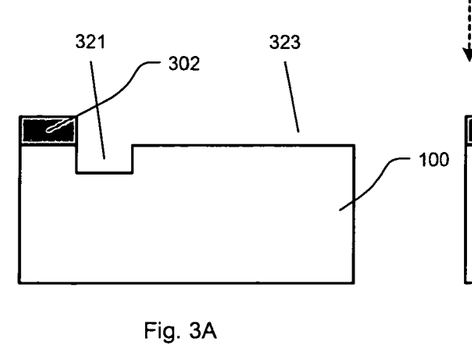
FIG. 3 depicts the process of over-etching regions of a phase shift mask.

To improve uniformity, an additional phase shift, for instance an additional 180-degree phase shift, may be added to a patterned mask, in addition to 180-degree phase shift windows previously created. FIG. 3A depicts a structure in which a 180-degree phase shift window has already been etched. The substrate 300 is overlaid by one or more non-transmissive layers 302. A 180-degree phase shift window has been etched in part of the substrate 321. In one area of the reticle 323, the non-transmissive layer has been removed but no phase shift window has been etched.

Figure 3B:
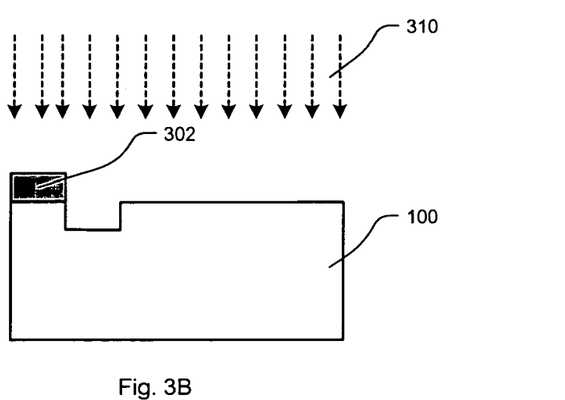
Figure 3C:
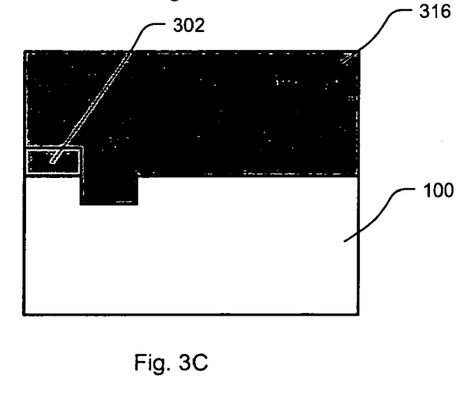
Figure 3D:
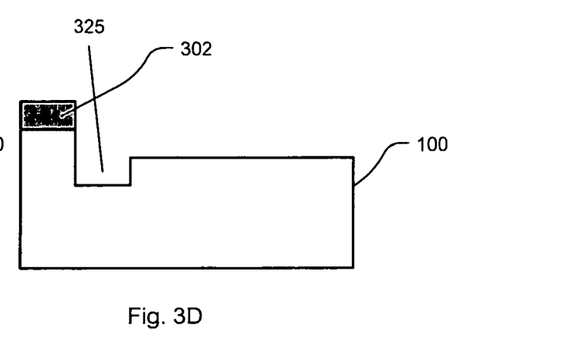

Either directional etching, depicted in FIG. 3B, or isotropic etching, depicted in FIG. 3C, can accomplish an additional phase shift etching. Plasma 310 may be used for directional etching, choosing plasma suitable to leave the non-transmissive layer intact while removing a portion of the substrate. Alternatively, a relatively nondirectional plasma 316 or a wet etch 316 can be used. The resulting structure is depicted in FIG. 3D. The phase shift window 325 appears as being etched deeper into the substrate than the non-phase shift transmissive window 327.

The basic steps of the process can be expressed in a list:
1. Begin with a reticle having a dual layer coating.
2. Expose the top, resist layer to an energy beam using a pattern generator to create a latent image.
3. Create a plasma etch barrier, corresponding to the latent image.
4. Directionally etch the transfer layer through the plasma etch barrier.
5. Remove the transfer layer, exposing the reticle substrate.

Figure 4A:
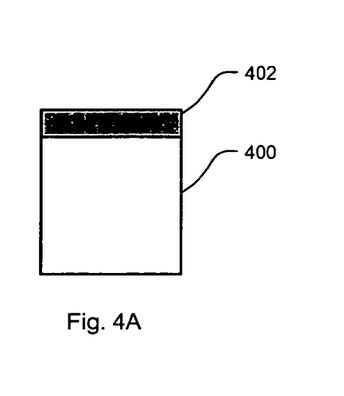
FIG. 4 is a block diagram of a reticle with dual layers of resist and transfer medium.
Figure 4B:
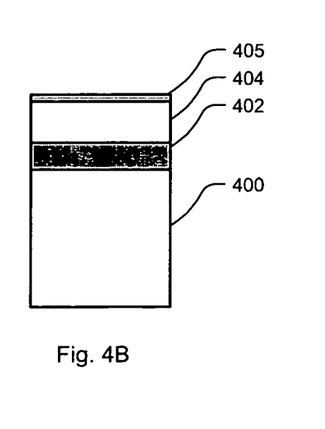
Figure 4C:
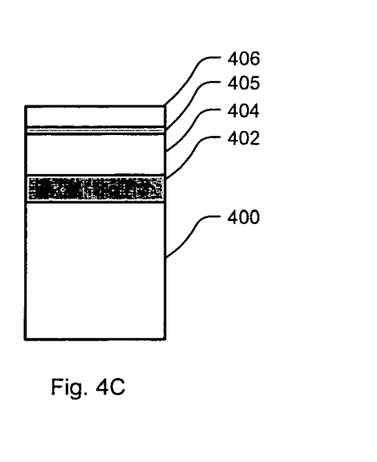

A method for preparing a reticle blank to be exposed is illustrated in FIGS. 4A–4C. This method forms a masking layer 402 over, but not necessarily on the reticle substrate. A transfer layer 404 is formed over, but not necessarily on the masking layer 402. An optional plasma resistive layer 405 may be formed over, but not necessarily on the transfer layer 404. A resistive layer 406 may be formed over, but not necessarily on the transfer and optional plasma resistive layers 404, 405.

Methods and devices practicing the present invention yield a variety of advantages. The process is relatively insensitive to the thickness of the resist and transfer layers, particularly the transfer layer. High-resolution, fine features are readily generated. Undercutting and widening of clear spaces is avoiding, facilitating generation of uniformly alternating lines and spaces. The sidewalls of trenches are nearly vertical. It is unnecessary to attempt a post-exposure bake. Without a post-exposure bake, image diffusion is minimized. For the initial patterning of the non-transmissive layer, precoated blanks can be used. The system is relatively insensitive to timing delays, thereby simplifying workflow. Use of a thin, transparent resist layer on top of a relatively thick underlayer or transfer layer having the nearly the same refractive index and a higher absorption minimizes interference effects, both standing wave and bulk interference effects. The same plasma reactor may be used for several process steps, to minimize the transfer of the reticle among pieces of equipment. This minimizes capital expenditure, floor space requirements, handling, and turnaround time. Inspection and repair of the resist layer tends to assure that the finished mask pattern has critical dimensions matching those intended and required.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of creating by a pattern generator features on a workpiece having a substrate, a masking layer, a transfer layer and a resist layer, including:
creating a latent image in the resist layer using a pattern generator;
creating a plasma etch barrier corresponding to said latent image;

directionally etching the transfer layer through said plasma etch barrier;

directionally etching the masking layer through said transfer layer; and removing said transfer layer, exposing unetched portions of the masking layer;

wherein the resist layer is approximately 150 nm thick and the transfer layer is between 200 and 500 nm thick.

2. The method of claim 1, wherein the resist layer is approximately 150 nm thick and the transfer layer is approximately 350 nm thick.

3. The method of claim 2, wherein the transfer layer is essentially non-transmissive to an energy beam used to create said latent image.

4. The method of claim 1, wherein the transfer layer is removed using a first plasma chemistry.

5. The method of claim 4, wherein the first plasma chemistry contains halogen ions.

6. The method of claim 4, wherein the first plasma chemistry is an oxygen plasma.

7. The method of claim 4, wherein transfer layer is an organic layer and the first plasma chemistry is an oxidizing plasma.

8. The method of claim 1, wherein the directional etching of the transfer layer and the masking layer is done by RIE-type etching and the removing of the transfer layer is done by a non-preferential oxygen plasma.

9. A method of creating by a pattern generator features on a workpiece having a substrate, a masking layer, a transfer layer and a resist layer, including:

creating a latent image in the resist layer using a pattern generator;

creating a plasma etch barrier corresponding to said latent image;

directionally etching the transfer layer through said plasma etch barrier;

directionally etching the masking layer through said transfer layer; and removing said transfer layer, exposing unetched portions of the masking layer;

wherein the plasma etch barrier comprises silicon in the resist layer.

10. The method of claim 9, wherein the silicon in the resist layer is present before the latent image is created.

11. The method of claim 9, wherein the silicon in the resist layer is added after creating the latent image by treating the resist layer with a silicon compound.

12. The method of claim 9, wherein the silicon is present in the resist layer before the exposure and a pattern is formed by etching through the resist.

13. The method of claim 9, wherein the silicon is added to the resist layer by treatment by a silicon compound after the development of the resist layer.

14. A method of creating by a pattern generator features on a workpiece having a substrate, a masking layer, a transfer layer and a resist layer, including:

creating a latent image in the resist layer using a pattern generator;

creating a plasma etch barrier corresponding to said latent image;

directionally etching the transfer layer through said plasma etch barrier;

directionally etching the masking layer through said transfer layer; and removing said transfer layer, exposing unetched portions of the masking layer;

wherein the plasma etch barrier comprises a separate film between the resist layer and the transfer layer.

15. The method of claim 14, wherein the plasma etch barrier comprises a thin film deposited by sputtering.

16. The method of claim 14, wherein the plasma etch barrier comprises a metal-containing film.

17. The method of claim 14, wherein the plasma etch barrier comprises an aluminum film.

18. The method of claim 14, wherein the plasma etch barrier comprises a metal oxide film.

19. The method of claim 14, wherein the plasma etch barrier comprises a silicon-containing film.

20. The method of claim 14, wherein the plasma etch barrier comprises a silicon oxide film.

21. The method of claim 14, wherein the plasma etch barrier is patterned by plasma etching through the resist layer.

* * * * *